(12) United States Patent
Jensen

(10) Patent No.: US 11,066,328 B2
(45) Date of Patent: Jul. 20, 2021

(54) LOW REFLECTIVITY COATING AND METHOD AND SYSTEM FOR COATING A SUBSTRATE

(71) Applicant: SURREY NANOSYSTEMS LIMITED, Sussex (GB)

(72) Inventor: Ben Poul Jensen, Eastbourne (GB)

(73) Assignee: SURREY NANOSYSTEMS LIMITED, East Sussex (GB)

( * ) Notice: Subject to any disclaimer, the term of this patent is extended or adjusted under 35 U.S.C. 154(b) by 0 days.

(21) Appl. No.: 16/788,203

(22) Filed: Feb. 11, 2020

(65) Prior Publication Data
US 2020/0181010 A1    Jun. 11, 2020

Related U.S. Application Data

(63) Continuation of application No. 15/743,626, filed as application No. PCT/GB2016/052668 on Aug. 26, 2016, now Pat. No. 10,604,443.

(30) Foreign Application Priority Data

Aug. 27, 2015   (GB) ...................... 1515270
Sep. 4, 2015    (GB) ...................... 1515694
Sep. 16, 2015   (GB) ...................... 1516423
Feb. 4, 2016    (GB) ...................... 1602031

(51) Int. Cl.
*C03C 17/42*    (2006.01)
*G02B 5/00*     (2006.01)
(Continued)

(52) U.S. Cl.
CPC ............. *C03C 17/42* (2013.01); *B82Y 30/00* (2013.01); *C01B 32/00* (2017.08); *C23C 16/00* (2013.01);
(Continued)

(58) Field of Classification Search
CPC ............. C03C 17/42; C03C 2218/112; C03C 2218/33; B82Y 30/00; B82Y 20/00;
(Continued)

(56) References Cited

U.S. PATENT DOCUMENTS

2006/0278902 A1* 12/2006 Sun ................. B82Y 10/00
                                                 257/288
2009/0085894 A1   4/2009 Gandhi et al.
(Continued)

FOREIGN PATENT DOCUMENTS

JP    2013148744    8/2013
KR    20050035191   4/2005
(Continued)

OTHER PUBLICATIONS

KR_20100108984_Machine Translated.pdf (Year: 2010).*
(Continued)

*Primary Examiner* — Nadine G Norton
*Assistant Examiner* — Mahmoud Dahimene
(74) *Attorney, Agent, or Firm* — James S. Keddie; Bozicevic, Field & Francis LLP

(57) ABSTRACT

A low reflectivity coating (20) is formed of a layer of carbon nanostructures (20) over a contact surface (14) of a substrate (10), from a spray incorporating the carbon nanostructures in suspension in a solvent. The carbon nanostructure layer provides a very low reflectivity coating which may be further enhanced by etching the outer surface of the coating. The layer may be etched for reduced reflectivity. Very low reflectivity coatings have been achieved.

15 Claims, 13 Drawing Sheets

(51) Int. Cl.
   *C01B 32/00*   (2017.01)
   *C23C 16/00*   (2006.01)
   *B82Y 30/00*   (2011.01)
   *B82Y 20/00*   (2011.01)
(52) U.S. Cl.
   CPC .............. *G02B 5/003* (2013.01); *B82Y 20/00* (2013.01); *C03C 2218/112* (2013.01); *C03C 2218/33* (2013.01); *G02B 2207/101* (2013.01)
(58) Field of Classification Search
   CPC ......... C23C 16/00; C01B 32/00; G02B 5/003; G02B 2207/101; G02B 5/00
   See application file for complete search history.

(56) References Cited

U.S. PATENT DOCUMENTS

| | | |
|---|---|---|
| 2012/0097239 A1 | 4/2012 | Sato et al. |
| 2012/0100346 A1 | 4/2012 | Tazawa et al. |
| 2015/0210951 A1 | 7/2015 | Aizenberg et al. |

FOREIGN PATENT DOCUMENTS

| | | |
|---|---|---|
| KR | 20100108984 | 10/2010 |
| KR | 20100108984 A * | 10/2010 |
| WO | WO 03/086961 | 10/2003 |

OTHER PUBLICATIONS

Keshri et al., "Structural transformations in carbon nanotubes during thermal spray processing", Surface & Coating Technology, 2009, 203(16):2193-2201.

Kaempgen et al., "Transparent carbon nanotube coatings", Applied Surface Science, 2005, 252(2):425-429.

Li et al., "UV/mask irradiation and heat induced switching on-off water transportation on superhydrophobic carbon nanotube surfaces", Surface & Coating Technology, 2014, 258:142-145.

Kim et al., "Patterning of carbon nanotube films on PDMS using SU-8 microstructures", Microsyst Technol, 2013, 19 (5):743-748.

* cited by examiner

LOW REFLECTIVITY COATING AND METHOD AND SYSTEM FOR COATING A SUBSTRATE

CROSS-REFERENCE TO RELATED APPLICATIONS

This application is a continuation of U.S. application Ser. No. 15/743,626, filed on Jan. 10, 2018, which is a § 371 national phase of International Application No. PCT/GB2016/052668, filed on Aug. 26, 2016, which claims the benefit of United Kingdom Patent Application No. 1515270.5, filed on Aug. 27, 2015, United Kingdom Patent Application No. 1515694.6, filed on Sep. 4, 2015, United Kingdom Patent Application No. 1516423.9, filed on Sep. 16, 2015, and United Kingdom Patent Application No. 1602031.5, filed on Feb. 4, 2016, which applications are incorporated by reference herein.

TECHNICAL FIELD

The present invention relates to a method of coating a substrate with carbon nanostructures low reflectivity coating and to a method and apparatus for coating a substrate.

BACKGROUND OF THE INVENTION

For a very long time there have been efforts to produce environmentally stable coatings and devices having very low reflectivity for a variety of industrial and scientific applications. They are important in imaging systems, calibration targets, instrumentation, light guides, baffles, stray light suppression and many other uses.

To be commercially useful, these coatings must have a low reflectance, but as important, they should exhibit the following: be spectrally flat, low outgassing, low particulate fallout, thermal shock resistance, resistance to moisture and high resistance to shock and vibration. These can be key requirements, as the coatings are often local to high sensitivity electronic detectors such as CCD or micro bolometers. Any contamination from such coatings will inevitably collect or condense on the detectors rendering them faulty or lowering their performance beyond an acceptable threshold.

Until recently, the best spray applied coatings have achieved a reflectivity of around 2.5% in the visible spectrum (380 nm-760 nm wavelength), although some experimental studies have achieved better results by using CVD grown, aligned carbon nanostructures, for instance around 0.045 to 0.5% total hemispherical reflectance (THR) when deposited on small lab scale substrates. One example of an aligned absorber is: US patent application: 2009/0126783 by Shawn-Yu Lin et al of Rensselaer Polytechnic Institute, entitled: "Use of vertical aligned carbon nanotube as a super dark absorber for pv, tpv, radar and infrared absorber application". This document discusses a visible spectrum, highly absorbing aligned carbon nanotube film. Whilst interesting, these aligned array absorbers are grown at high temperatures >750° C. using complex and costly chemical vapour deposition (CVD) reactors and require even more complex catalyst steps created in Physical Vapour Deposition (PVD) reactors. This limits their use to specialist substrates with simple planar geometries that that are capable of fitting into existing reactors, thereby limiting their commercial applications to small, simple substrates that can tolerate the high temperatures (>750° C.) used during growth of the carbon nanotubes. Also, due to the CVD method used to grow these films, they tend to be very hydrophilic as, the present inventors have discovered, growth defects in the tube wall terminate to form highly polar hydroxyl, carbonyl and carboxyl functional groups on exposure to air. This hydrophilicity rapidly causes the film to lose its optical properties on exposure to atmospheric humidity or free water as it acts like a sponge.

A study by John H Lehman et al, "Single-Wall Carbon Nanotube Coating on a Pyroelectric Detector", Applied Optics, 1 Feb. 2005 vol. 44, No 4, has suggested that a low reflectivity coating formed from a solution of carbon nanotubes and a suitable solvent could exhibit high levels of absorbance when applied to pyroelectric detectors. These films created from a solvent/carbon nanostructure solution have shown that they are only able to achieve a total hemispherical reflectance (THR) of around 2%, which is only on a par with the best existing commercial black paints. This is due to the high density of the applied film resulting in multiple carbon nanotube sidewalls that act as an effective reflector. This allows incoming photons to be reflected without being absorbed. The sprayed coating is also hydrophilic and so suffers from the same atmospheric contamination issues as aligned array films. The coating also suffers from poor substrate adhesion.

In fields unrelated to optical absorbers, researchers have created solutions of solvent dispersed, functionalised carbon nanotubes for electronic ink applications. In this type of application, it is desired that the ink be stable, printable and have low electrical resistance after printing. An example patent is US-2013/0273257, "Carbon Nanotube Ink Composition and a Coating Method Thereof and a Forming Method of a Thin Film Containing Carbon Nanotubes". This document discloses the creation of functionalised carbon nanotubes in a solvent solution capable of being inkjet-printed. These types of carbon nanostructure inks do not make good optical absorbers as the functionalisations and surfactants used all contribute spectral features related to the chemical bonds in the surfactant that contribute to a large increase THR across critical parts of the electromagnetic spectrum.

It is also known that research groups have created super hydrophobic carbon nanotube films by depositing fluorocarbon or organosilanes on top of previously grown carbon nanotube films and powders. An example is described by Kenneth K S Lau, in "Nano Letters—Super Hydrophobic Carbon Nanotube Forests". This type of coating will prevent the aligned array or carbon nanotube powder from taking up moisture, but the hydrophobic coating thicknesses required to do so will reduce the film's absorbance due to the large difference in refractive index of the continuous hydrophobic coating, that blocks of the open space between the tubes, and the fact that the carbon nanotube/filament has a reduced ability to absorb photons when fully covered by a polymeric layer.

Prior art which discloses various methods of coating carbon nanostructures on substrates includes the following: US2016194205A; US2016053155A; US2014272199A; US2013316482A; US2013194668A; US2015298164A; US2013273257A; US2011315981A; US2011217544A; US2011111177A; US2010230344A; US2009026424A; US2008083950A; US2005013935A; and US2001004471A. However, none of these documents disclose any steps which result in ultra-low reflectivity coatings.

Other prior art documents include WO2003/086961 A2 (DU PONT); WO2007/075437 A2 (INTEMATIX); US2008/0171193 A1 (YI); WO2009/058763 A1 (UNIDYM); US2009/0050601 A1 (PARK); and CN104558659 A (U. BEIJING).

SUMMARY OF THE INVENTION

The present invention seeks to provide an improved method for coating a substrate with a low reflectivity coating. The method disclosed herein is suitable for coating a wide variety of substrates at commercial scales, including non-planar substrates and delicate substrates such as those which become unstable at elevated temperatures. The preferred embodiments disclosed herein are able to create a highly efficient electromagnetic (EM) absorber coating that overcomes the limitations discussed above.

According to an aspect of the present invention, there is provided a method of coating a substrate with carbon nanostructures, including the steps of: (i) providing a suspension of carbon nanostructures in a solvent; (ii) preheating a substrate to a sufficient temperature to cause the solvent to evaporate when the suspension contacts the substrate; and then (iii) spray-coating the suspension onto the substrate; (iv) maintaining the substrate at a sufficient temperature during step (iii) in order to maintain evaporation of the solvent being spray-coated; (v) continuing with steps (iii) and (iv) until a layer of carbon nanostructures has been coated on the substrate with a thickness of at least 2 micrometres (preferably at least 3 micrometres, most preferably at least 6 micrometres; and (vi) plasma etching the coating to reduce film density and create the optical cavities in the coating, adding an optical spacer to the suspension prior to the depositing step in order to create optical cavities in the coating, or a combination thereof.

The minimum thickness required to make a 0.2% THR reflectance at 700 nm is preferably 6 microns average coating height Optical cavities may be created by a step of plasma etching the coating, which will reduce film density and create a coral like open structure of nonaligned carbon nanotubes and residual amorphous carbon. This open structure is mechanically stable and suitable for trapping and absorbing, for example, UV-MIR (100-8000 nm) wavelengths with very high efficiency (THR of 0.2%).

Optical cavities may also be formed by the use of temporary or permanent optical spacer particles provided in the suspension during application of the carbon nanostructures to the substrate, as described in detail below. Optical spacers are particularly suitable for trapping longer wavelengths (NIR-GHz). In some embodiments both optical spacers and plasma etching are used.

The skilled person will appreciate that the step of creating optical cavities, whether by etching or provision of optical spacers or a combination of the two, will create additional or enhanced optical cavities over any cavities which naturally appear in the layer of carbon nanostructures.

Where optical spacer particles are used to create optical cavities, in some embodiments there may be provided a spray including the carbon nanostructures with the optical spacers suspended in a solvent, for application directly to an article to be at least partially coated. When the solvent dries, the carbon nanostructures with optical spacers dispersed therewithin will form a low reflectivity coating on the article. The material could similarly be provided in a form other than a spray, such as in a paint or ink.

Advantageously, the method also includes the step of providing protective functionalization to the coating of carbon nanostructures, preferably without increasing the reflectance of the coating.

In preferred embodiments, the method also includes the step of providing a discontinuous protective coating over the coating of carbon nanostructures, preferably without increasing the reflectance of the coating.

The inventors have discovered that it is possible to create a very black coating with a very low reflectance, by depositing carbon nanostructures from a suspension onto a substrate and etching the carbon nanostructure layer to form optical cavities in the layer, in the alternative or in addition, optical spacers may be created by permanent or temporary fillers to the carbon nanostructures in suspension. The carbon nanostructures are preferably carbon nanotubes (most preferably multi-walled nanotubes; even more preferably nanotubes with ≥98% carbon basis, O.D.×I.D.×L 10 nm±1 nm×4.5 nm±0.5 nm×3-~6 μm, provided by Sigma Aldrich), which are deposited in a random matrix as a layer or coating on the substrate. Previous attempts at producing low reflectance coatings have involved forming the carbon nanotubes on a catalyst coated substrate, which can involve limitations to the types of substrate which can be coated and limitations to the characteristics of the coating.

The method may include the step of roughening the contact surface of the substrate prior to depositing the layer of carbon nanostructures in suspension. Roughening may be in addition to or in place of passivation. Roughening can enhance the bonding of the carbon nanostructures to the substrate and improve the grazing angle performance of the film. The surface roughening may be by wet chemical etching, or by impacting the surface with grit at high speed. More generally, in order to achieve a further reduction in reflectivity, the method may include the step of etching the substrate to be coated, which creates a surface roughness to the exposed surface of the carbon nanostructure layer. This can be achieved by bombarding the surface of the substrate with aluminium oxide grit of a maximum size range of 10 to 150 micrometres. The grit can be supplied either as a slurry or dry, and delivered to the surface at a suitable velocity for the hardness of the material be etched. The etching process delivers a plurality of peaks and valleys uniformly across the surface. This etching step provides an improved bonding surface, enhanced absorption and also improves grazing angle reflectance of the coated part. The etch surface is then cleaned and dried in a suitable manner. The surface roughness also helps to create optical cavities in the carbon nanostructure layer.

The method may include the step of providing a chemically applied conversion coating to the, preferably mechanically or chemically roughened, surface of the substrate prior to depositing the layer of carbon nanostructures in suspension. The conversion coating applied to the surface creates surface platelets or contact points which can enhance the bonding of the carbon nanostructures to the substrate and also help reduce reflectance in the coating, as it produces a repeatable but local non-uniformity in the surface structure. This helps to provide a uniformly irregular surface that improves optical absorption in the film.

Preferably, the method includes the step of applying a bonding or adhering agent to the contact surface of the substrate prior to depositing the layer of carbon nanostructures. The bonding or adhering agent may be polyimide or other heat curable polymer that has suitable thermal stability and will not degrade when in contact with the nanostructure solution. In this embodiment, the method may include the step of heating or curing the bonding or adhering layer during the step of depositing the layer of carbon nanostructures thereon. This enables the carbon nanostructures to become partially embedded in the layer. The solvent used to disperse the carbon nanostructures is 'vaporised' sufficiently quickly so as not to dilute the bonding agent or chemically react with it. During curing, additional coating thickness is built up to achieve a desired overall thickness of the absorber layer.

The method may include the step of adding a permanent optical spacer or filler, or a filler that can be later removed by heat or other means, leaving behind a cavity able to trap specific wavelength ranges of the electromagnetic spectrum. These fillers are added to the suspension prior to the depositing step. The optical spacer may be transmissive or absorbing of a frequency of radiation desired to be absorbed by the coating, or may be absorbing and designed only to create free volume in the coating. Examples include zinc sulphide, zinc selenide, silicon carbide, silicon nitride, styrene or amorphous carbon nanospheres. An example of a thermally removable spacer is naphthalene nanoparticles. When heated, they sublime leaving the original particle shape as a cavity in the coating. Optical spacers of such a naphthalene nanoparticles create optical cavities within the layer of carbon nanostructures which can trap light or other radiation incident on the coating.

In preferred embodiments, the optical spacer or filler is in the form of particles having an average diameter of nanometres to tens of micrometres depending on the wavelength of radiation to be absorbed.

In the preferred embodiments, the solvent is free of surfactants. It has been found that surfactants in the coating can lead to an increase in reflectivity and a loss in blackness of the coating or, at best, a surfactant will create unwanted, large spectral features (areas of higher reflectivity) within the coating.

The carbon nanostructure suspension is preferably deposited on the contact surface of the substrate by spraying. In other embodiments, this could be by slot-coating, dipping, spinning, brushing or electrostatic coating.

The solvent preferably has a polarity index of from 0.2 to 6.7, more preferably from 3.0 to 6.2 (where pentane has a reference polarity of 0). In a preferred embodiment, the solvent is chloroform, although any other suitable solvents could be used, such as ethanol, ethyl acetate, acetone, cyclohexane, tetrahydrofuran, dimethyl formamide or N-methyl-2-pyrrolidone. In scenarios in which the use of chloroform is undesirable (for example because of health risks), it is believed that ethanol or ethyl acetate should be good alternatives.

Chloroform has long been acknowledged as an exceptional solvent for a range of solutes and there is some evidence that this is due to its unique ability to orient its molecules in polar "stacks" which may allow for greater stabilisation of the carbon nanostructures (see Shepard et al., Chem. Commun., 2015, 51, 4770-4773). In the case of the present invention, it has been discovered that a highly dispersed solution of carbon nanostructures is undesirable as it allows for very dense packing of the carbon nanostructures on solvent evaporation. A certain degree of agglomeration is preferred as this has been found to result in poorly packed carbon nanostructures, with the porosity of the resultant structure allowing for efficient light trapping. In a preferred embodiment, the solvent should have a relatively low boiling point (<150° C.) and an intermediate polarity index between 3 and 6. The presence of a sterically accessible nucleophile (electron donor) is beneficial but not critical to the solvent's function.

The properties of a number of preferred solvents are listed in the Table below, with water also being listed for comparison:

| | Polarizability ($\pi^*$) | H-bonding property ($\alpha$) | E-pair donation ($\beta$) | Boiling point/° C. | Polarity |
|---|---|---|---|---|---|
| Ethanol | 0.54 | 0.83 | 0.77 | 78.4 | 5.2 |
| Ethyl acetate | 0.55 | 0.00 | 0.45 | 77.1 | 4.4 |
| Chloroform | 0.58 | 0.44 | 0.00 | 61.2 | 4.1 |
| THF | 0.58 | 0.00 | 0.55 | 66.0 | 4 |
| Acetone | 0.71 | 0.08 | 0.48 | 56.0 | 5.1 |
| Water | 1.09 | 1.17 | 0.18 | 100.0 | 9 |

In preferred embodiments, once deposited, the film, composed of randomly orientated carbon nanostructures, is reduced in density by plasma etching for at least 900 seconds (time is specific to reactor geometry and design). The set-up of the plasma is such that it reduces the density of the film and opens up optical trapping cavities, so as to improve the bulk film's absorption from UV-NIR. Typically a tenfold improvement in THR will be achieved by plasma etching the coating in this way.

It should be noted that short etches of around 15 seconds, such as those found to improve performance on vertically aligned nanotube coatings, will only provide a marginal or no improvement in this solution processed coating. This is due to the difference in density of the starting coating and because the tubes are nonaligned. Further, it has been shown that etching a vertically aligned nanotube coating in an oxygen plasma will provide a 30% improvement in reflectance if etched for 10-20 seconds, but etching for any longer period provides no further improvement, and will start to damage or completely destroy the optical properties, and etches of 100 seconds can completely remove the coating from the substrate. As the starting density of the solution processed coating is higher, and because the nanotubes are randomly orientated in the horizontal plane, so the plasma etching process takes longer to achieve a performance improvement. Conventional vertically aligned CNT plasma etching gives a performance improvement by clustering the tips of the tubes and giving a slight reduction in density, thereby making an irregular surface and open cavities for light to be trapped and absorbed after multiple reflections within the aligned CNT forest. With the solution processed film, the tubes are randomly aligned and generally horizontal to the plane of the surface being coated. A plasma is used to etch cavities that are suitable for trapping electromagnetic energy from UV-NIR. The etching process effectively reduces the density of the bulk 'as sprayed' film. That reduction in density and open structure allows photons to enter and 'bounce' multiple times until absorbed by the carbon nanotubes.

According to another aspect of the present invention, there is provided an article coated with a layer of carbon nanostructures, wherein the carbon nanostructures are randomly disposed in the layer and free of surfactants, the coating including optical cavities for trapping electromagnetic radiation.

There may be provided optical spacers in the layer of carbon nanostructures, advantageously being transmissive or absorbing of a frequency of radiation desired to be absorbed by the coating.

Preferably, the carbon nanostructures have a length of at least 2 to 10 micrometres and/or are in the form of carbon nanotubes.

In practice, the carbon nanostructure layer may have a low reflectance of 2% THR (total hemispherical reflection) in the visible spectrum, even less in preferred embodiments.

According to a further aspect of the present invention, there is provided a method of coating a substrate with a layer of carbon nanostructures, including the steps of: forming or obtaining a suspension of carbon nanostructures in a solvent; depositing a layer of the carbon nanostructures in suspension on a contact surface of a substrate; drying the solvent, thereby leaving a coating of carbon nanostructures on the contact surface of the substrate; and creating optical cavities in the coating for trapping electromagnetic radiation, preferably, by adding an optical spacer or filler to the suspension prior to the depositing step, wherein the optical spacer is or includes zinc sulphide, zinc selenide, styrene or amorphous carbon Other features and advantages will become apparent from the description and drawings which follow.

BRIEF DESCRIPTION OF THE DRAWINGS

Embodiments of the present invention are described below, by way of example only, with reference to the accompanying drawings, in which.

DESCRIPTION OF THE PREFERRED EMBODIMENTS

The Figures show in schematic form embodiments of apparatus for coating a substrate with a carbon nanostructure layer having very low and preferably ultra-low reflectivity. The embodiments disclosed herein have exhibited a reflectivity considerably less than 2.5% and in most cases of less than 0.5%. The preferred embodiments have exhibited a THR of around 0.2% within the visible spectrum.

Figure 1:
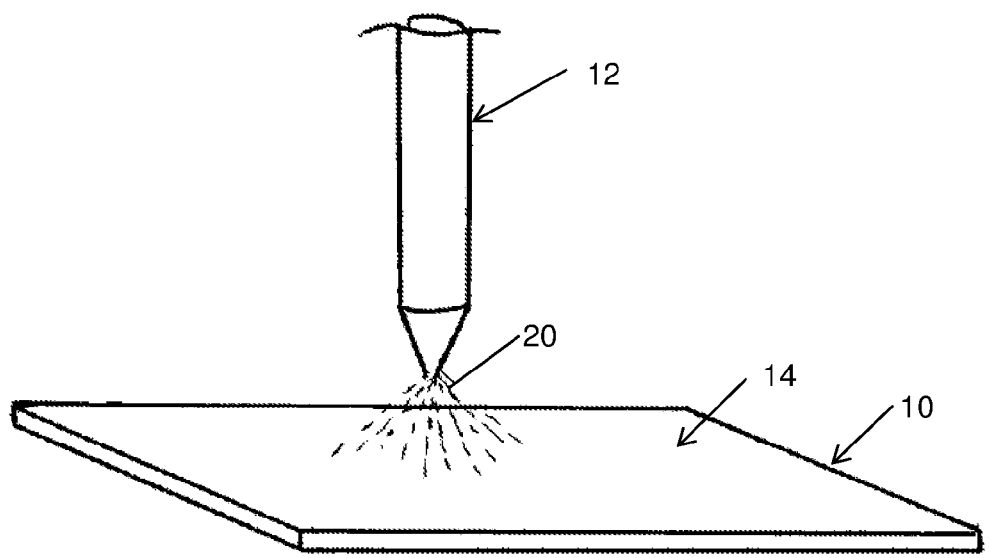
FIG. 1 is a schematic diagram depicting a first step of a preferred embodiment of applying a carbon nanostructure coating to a substrate.

Referring first to FIG. 1, this shows in schematic form a method of applying a low reflectivity coating of carbon nanostructures onto a substrate 10. The substrate may be any article for which it is desired to have at least one surface with a very low reflectivity. Examples include scientific instrumentation, light guides, telescope tubes, baffles, stray light suppression and many other uses.

The substrate 10 could be of any suitable material and the teachings herein permit the material to have a wide range of characteristics, including a wide range of temperatures at which the substrate is stable, that is but not limited to melting or softening temperatures. In many practical applications, the substrate 10 may be of a metal or metal alloy but could equally be made of a variety of other materials including polymers.

FIG. 1 shows a very simple and preferred coating system for coating the substrate 10 with a layer of carbon nanostructures. The system includes a spray device 12, which may typically be a nozzle, array of nozzles or one or more spray slots, operable to dispense in a spray jet carbon nanostructures suspended in a solvent. The spray coats the contact surface 14 of the substrate 10 with a layer of carbon nanostructures and when the solvent evaporates, typically either naturally in air at room temperature or by heating, there is left a dried layer of carbon nanostructures on the substrate. In some embodiments the layer is constituted solely by carbon nanostructures, while in other embodiments there may be optical spacers. Further details are described below.

The carbon nanostructures are preferably in the form of carbon nanotubes, advantageously having a length of around 2 to around 10 micrometres. Carbon nanotubes having such characteristics are readily available for purchase and can also be manufactured by any of the methods described in the above-mentioned patent applications and also by any other known methods.

Spray coating, in the manner depicted in FIG. 1, is the preferred method of applying a coating to a substrate as this can be readily controlled to form a uniform layer of carbon nanostructures in random orientations on a surface. Other coating methods may be used including, for example, slot-coating, dipping, spinning, brushing and the like. The carbon nanotubes may also be applied to the substrate by an electrostatic coating method.

It is to be appreciated that where a coating process occurs over a period of time and/or is applied to a warm substrate, the coating may dry at the time it is applied and not in a subsequent drying step. For example, in the case of spraying onto a warm substrate, the solvent evaporates on contact with the warm substrate, such that drying occurs continuously as the coating is built up. Such continuous and rapid drying can produce a more open structure of carbon nanotubes compared to a process which applies a wet coating which is subsequently dried in a separate stage. Of course, in some embodiments the carbon nanostructures in suspension can be applied to the substrate and then the solvent dried in a separate step after coating.

Figure 2:
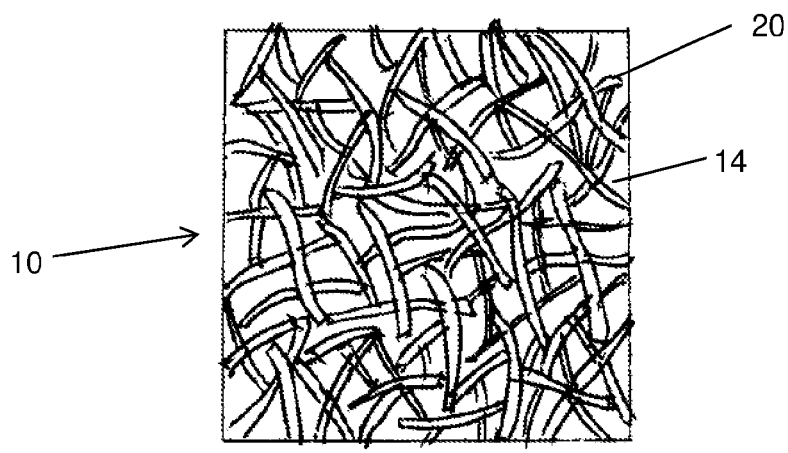
FIG. 2 is an enlarged schematic plan view of the coated substrate following the process step of FIG. 1.
Figure 3:
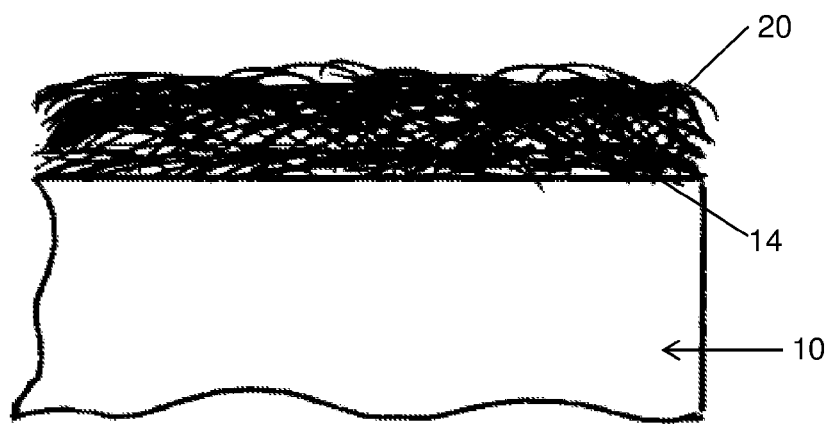
FIG. 3 is a side elevational, enlarged, view of the coated substrate of FIG. 2.

With reference now to FIGS. 2 and 3, these show in schematic form the arrangement of the carbon nanostructures 20 on the contact surface 14 of the substrate 10 after coating and drying. In the example of FIG. 3, the carbon nanostructures 20 are deposited directly on the substrate 10, for which it is advantageous if the contact surface is roughened and conversion coated prior to the depositing step. The conversion coating, typically by a wet chemical treatment process such as Alochrom (Used on Aluminium substrates) on contact surface 14. This creates platelets at the contact surface 14 which enhance the bonding properties of the surface. Passivation is known in the art of material surface treatment.

In some embodiments, instead of or in addition to passivation, the contact surface 14 may be roughened prior to depositing the layer of carbon nanostructures. Roughening creates attachment or key points which enhance the bonding of the carbon nanostructures to the substrate and also help improve grazing angle reflectance. An embodiment involves bombarding the surface of the substrate with a grit, for instance of aluminium oxide, of a maximum size range of 10 to 150 micrometres. The grit can be supplied either as a slurry or dry, and delivered to the surface at a suitable velocity for the hardness of the material to be etched. The etch surface is then cleaned and dried in a suitable manner. The etching process delivers a plurality of peaks and valleys uniformly across the surface. This etching process provides an improved bonding surface, enhanced absorption and also improves grazing angle reflectance of the coated part. The surface roughness also helps to create optical cavities in the carbon nanostructure layer.

As explained above, once the carbon nanostructures in solution are deposited onto the contact surface 14 of the substrate 10, the solvent is evaporated, so as to leave the dried carbon nanostructures 20 as a layer on the substrate 10. In the preferred embodiment, chloroform is used as the suspension medium and this can be dried either at room temperature or at higher temperatures in order to remove the solvent from the carbon nanostructure layer. In practical embodiments, any suitable solvent may be used, preferably of a type which evaporates at temperatures between about 60° C. to about 300° C. Such temperatures are suitable for a wide variety of substrate types.

The carbon nanostructures typically lie substantially planar to the contact surface 14 and can be described as lying horizontally thereto.

Figure 4:
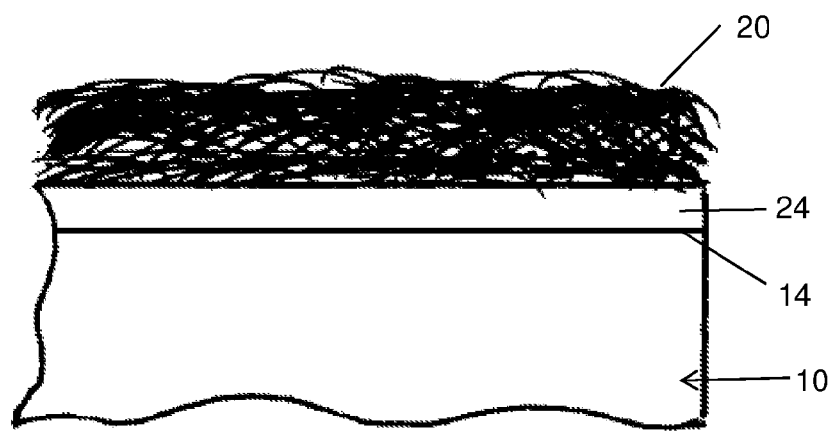
FIG. 4 is a side elevational, enlarged, view of the coated substrate of another embodiment of coated substrate.

With reference now to FIG. 4, this shows in schematic form a side elevational view of another embodiment of article, in which there is provided a bonding or adhesive layer 24 on the contact surface 14, between the substrate 10 and the layer of carbon nanostructures 20. In the preferred embodiment, the bonding layer 24 is made of a low outgassing polymer. A suitable polymer is polyimide, although other polymers may be used such as polyamides and epoxies. The layer of low outgassing polymer may typically have a thickness of 50-60 nanometres but may also be thicker, for example of one or more micrometres.

Advantageously, the polymer is heated or cured during the stage of applying the carbon nanostructures to the substrate 10, which enables the carbon nanostructures to become partially embedded within the bonding layer 24. A bonding layer 24 is useful for coating substrates formed of materials which otherwise may not bond strongly directly with the carbon nanostructures 20. In practice, the stage of depositing carbon nanostructures on the substrate 10 continues after the bonding layer 24 has been cured, or cooled, so as to build up a thickness of pure carbon nanostructures 20. In this manner, the material of the bonding layer 24 does not interfere with the reflectivity characteristics of the carbon nanostructure layer 20. In cases where the boding layer 24 is melted or softened, the process temperature could be reduced during continued coating with carbon nanostructures, in order to harden the bonding layer 24 and allow the formation of a coating of pure carbon nanostructures above the bonding layer 24.

The skilled person will appreciate that a bonding layer may not be necessary and that in many embodiments the carbon nanostructures will attach to the substrate through Van der Waals forces.

In practice, the carbon microstructure suspension can be formed by mixing carbon nanostructures in a volume of solvent, preferably by sonication, that is by sonic induced mixing. It has been found that a sonic mixing stage of 3 to 4 hours can achieve good dispersion of the carbon nanostructures within the solvent. Suitable solvents include chloroform, cyclohexane, tetrahydrofuran, dimethyl formamide and N-methyl-2-pyrrolidone. In some embodiments, water may be used as a solvent, preferably with one or more surfactants such as SDBS (sodium dodecylbenzenesulphonate) or Solsperse 44000 (available from Avecia Inc.).

The coatings depicted in FIGS. 2 to 4 provide a very black, low reflectivity, coating on a substrate 10 and it has been found that this can have a substantially lower reflectivity than known paints and other black coatings. In this form, the coating may be more than adequate for a wide variety of applications.

The reflectivity of the coating 20 can be further reduced by processing of the structures shown in FIGS. 2 to 4 to create optical cavities in the outer surface of the coating 20. This can be done by plasma enhanced chemical etching using apparatus of the type depicted in FIG. 5, for example. The step of etching or roughening the outer surface of the carbon nanostructure coating also increases the lam bertian nature of the surface, capturing and reflecting light over a wide range of angles, resulting in a matt appearance from every angle.

Figure 5:
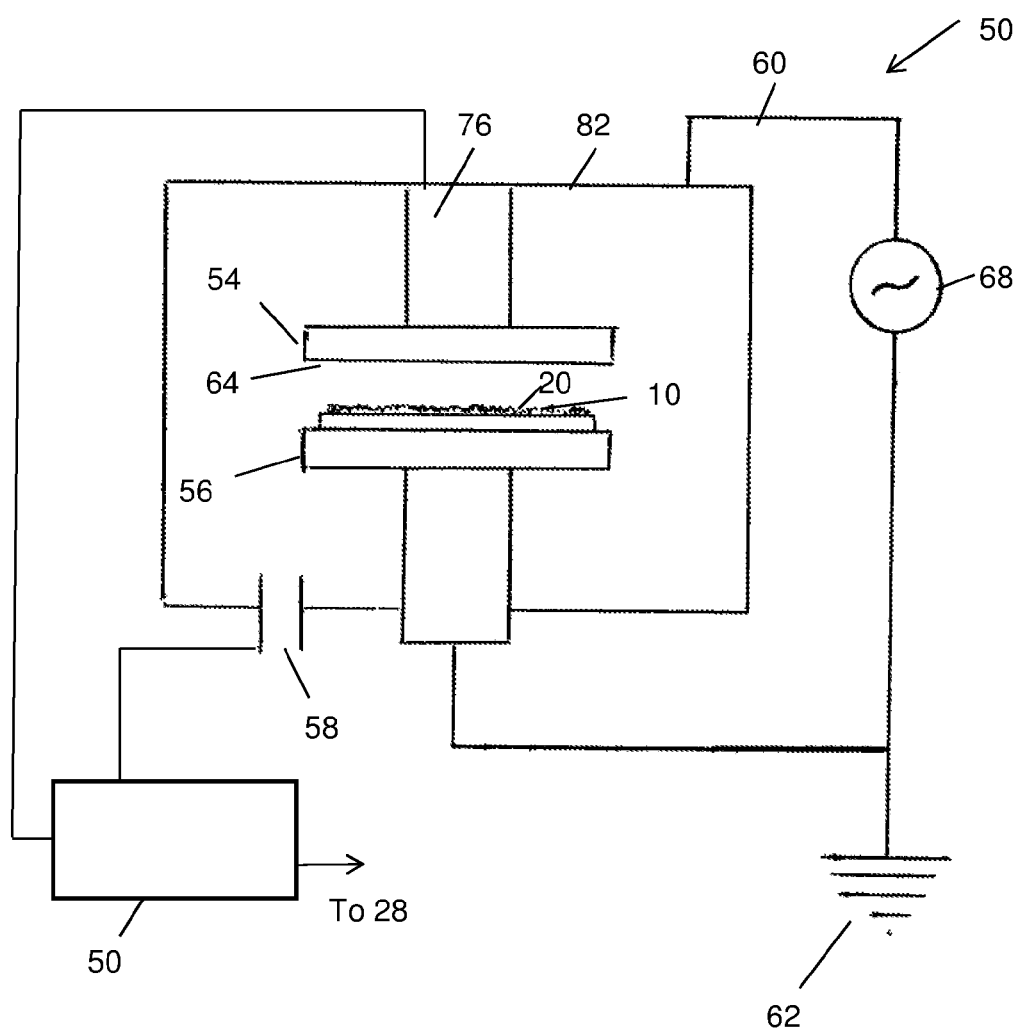
FIG. 5 is a schematic diagram of the principal components of apparatus for finishing a coating applied to a substrate according to the teachings herein.

Referring now to FIG. 5, this shows in schematic form the basic components of a plasma enhanced chemical etching system 50 for etching the outer surface of a layer 20 of carbon nanostructures on a substrate 10.

The apparatus 50 includes a sealable chamber 52, in which are disposed first and second electrodes 54, 56. The electrodes 54, 56 are, in this embodiment, plate-like structures which are substantially square or rectangular in plain view and shaped and sized to be able to accommodate the shape and size of an article to be etched by the apparatus. The electrodes 54, 56, though, do not need to have the specific form shown in FIG. 5.

The first electrode 54 is, in the configuration shown in FIG. 5, the cathode and is coupled by a conductor 60 to an alternating current supply 68. Most forms of plasma have shown to provide the improved reflectance. Optimum results have been achieved by an RF plasma, but DC, Pulsed DC and microwave frequencies can all be used. An atmospheric microwave, RF or DC plasma system can produce similar results.

In this particular embodiment, the electrode 54 has an array of perforations or apertures in its side 64 which faces article 10 to be finished. Coupled to the electrode 54 is a source 76 of oxygen, carbon tetrafluoride and/or other suitable material. The supply of gas from the source 76 can be controlled by a suitable device such as a mass flow controller (not shown in FIG. 5).

The source of gas 76 is fluidically coupled to the electrode 54 such that during operation of the apparatus 50 gas may exit through the nozzle or nozzles in the face plate 64 of the electrode 54, creating a plasma for use in etching the carbon nanostructure layer 20.

The second electrode 56 is coupled to ground 62. The electrode assembly 56 may be a complex structure of the type disclosed in the above-mentioned patent publications, including provisions for maintaining a low substrate temperature in order to enable processing of even delicate structures.

Coupled to the chamber 52 is an outlet 58 connected to a vacuum pump (not shown in FIG. 5) able to evacuate air within the chamber 52, as is well known in the art.

A coated structure, for example as shown in FIGS. 2 to 4, is positioned between the electrodes 54, 56 in the chamber 52 and then an etching plasma is created, for instance of oxygen but preferably of a fluorine containing gas such as carbon tetrafluoride. The plasma is maintained for a sufficient period to etch the top surface of the carbon nanostructure layer 20. In some practical examples, etching will be carried out for a few minutes, up to around 15 minutes or more. The length of the etching stage is dependent upon the density of the carbon nanostructures forming the layer 20, the depth of the layer 20 and the desired depth of roughness and reactor characteristics.

Figure 6:
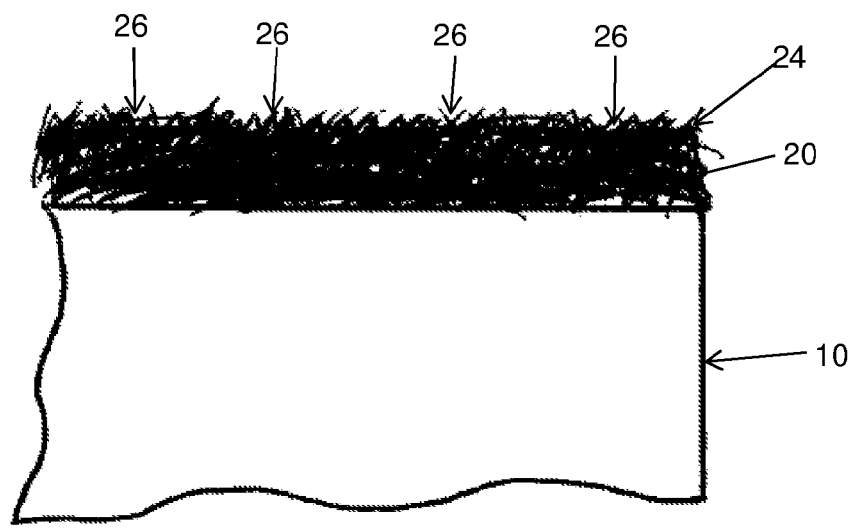
FIG. 6 is a side elevational view of a finished coated substrate.

With reference to FIG. 6, this shows in schematic form the effect of the etching process carried out by the apparatus shown in FIG. 5. The top surface 24 of the coating layer 20 is pitted by this process, so to create cavities 26 within the coating 20. The etching process will reduce the density and depth of the coating layer 20. The cavities 26 act as optical cavities able to trap light and other radiation impinging on the layer 20, thereby substantially reducing the reflectance of the surface. In an example, the reflectance of the coating can be reduced from around 2.0% to around 0.5% and even to around 0.2% by surface etching.

More specifically, in preferred embodiments, the deposited film, composed of randomly orientated carbon nanostructures, is reduced in density by plasma etching for a period which could be at least 900 seconds (time is specific to reactor geometry and design). The set-up of the plasma is such that it reduces the density of the film and opens up optical trapping cavities, so as to improve the bulk film absorption from UV-NIR. Typically a tenfold improvement can be achieved by plasma etching the coating.

Figure 7:
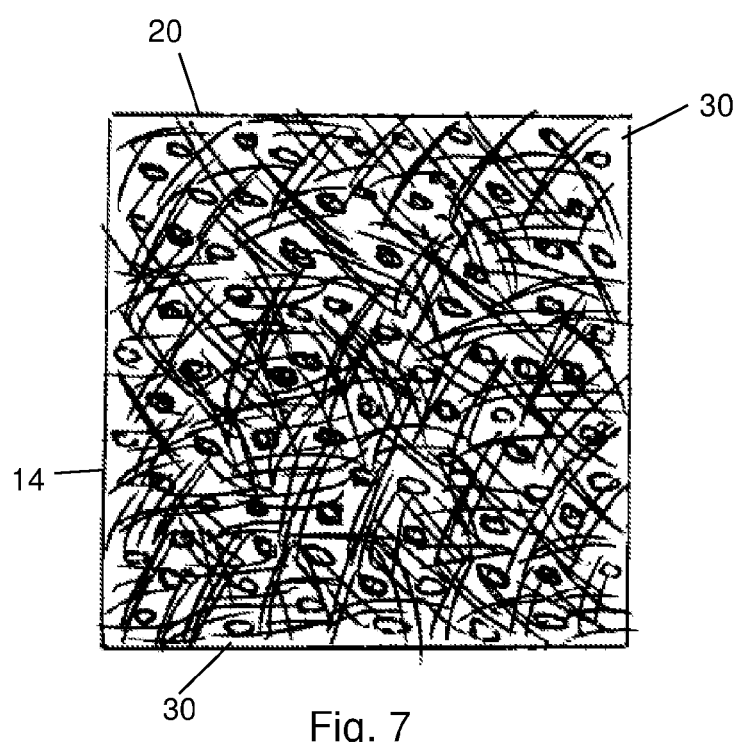
FIG. 7 is an enlarged schematic plan view of a coated substrate according to another embodiment of the invention.
Figure 8:
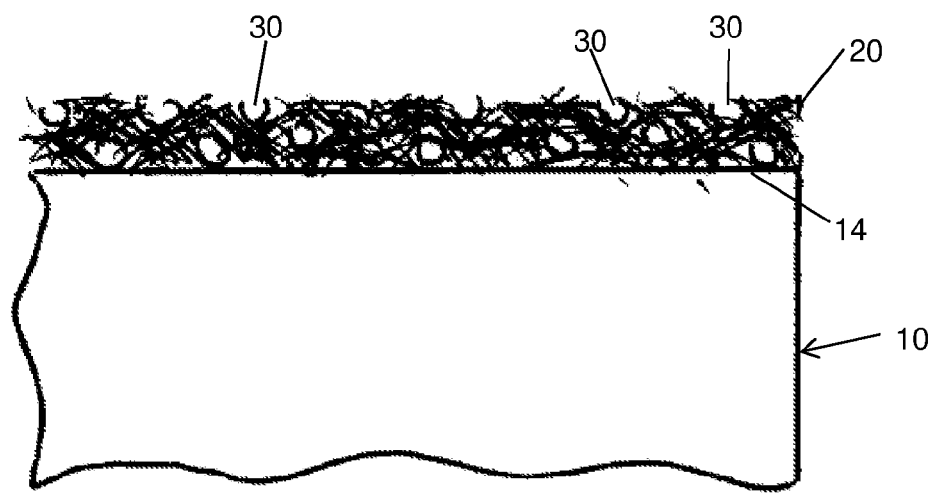
FIG. 8 is a side elevational, enlarged, view of the coated substrate of another embodiment of the invention.

The embodiments described above create a coating 20 of pure carbon nanostructures. It is envisaged that the coating 20 could in some embodiments have additional constituents apart from the carrier solvent used during the coating process. With reference to FIGS. 7 and 8, these show in schematic form two other embodiments according to the teachings herein. In one of these embodiments, there is added to the suspension optical spacer elements, in the form of particles which are also dispersed within the solvent. The optical spacers may be a transmissive or absorbing of one or more radiation frequencies or ranges of radiation frequencies, in dependence upon the desired characteristics of the coating 20. In one example, the optical spacer elements may be or include zinc sulphide and/or selenide, styrene or amorphous carbon nanospheres, for example. The particles may have an average diameter of a few nanometres to tens of micrometres (preferably 500 nm), in dependence upon the desired characteristics of the coating. In practical embodiments, the particles may have an average diameter of around 0.1 to 6 times the optical or other frequencies which it is desired that the coating absorbs.

As can be seen in FIGS. 7 and 8, once the suspension has been deposited onto the substrate 10 and the solvent evaporated, the coating layer includes a structure or mesh of carbon nanostructures 20 having interposed therewithin the optical spacer particles 30. The optical spacer particles 30 create optical cavities within the structure which assist in trapping light or other radiation impingent on the surface 20.

In another embodiment, instead of permanent optical spacer elements a removable filler is used, formed of removable optical filler particles. Naphthalene is a suitable material for this purpose and the skilled person will be able to identify others. The temporary filler is removed from the layer after drying, that is after removal of the solvent. The temporary filler particles preferably have similar characteristics in terms of size and density to the permanent optical spacer elements described above. The particles can be removed, for example, by heating or chemical removal, so as to leave optical gaps or cavities 30 within the coating layer 20.

In embodiments which include optical spacers or cavities within the layer 20, it may not be necessary to carry out the etching process described above with reference to FIGS. 5 and 6, although it is not excluded that such a step could also be carried out for these embodiments.

Figure 9:
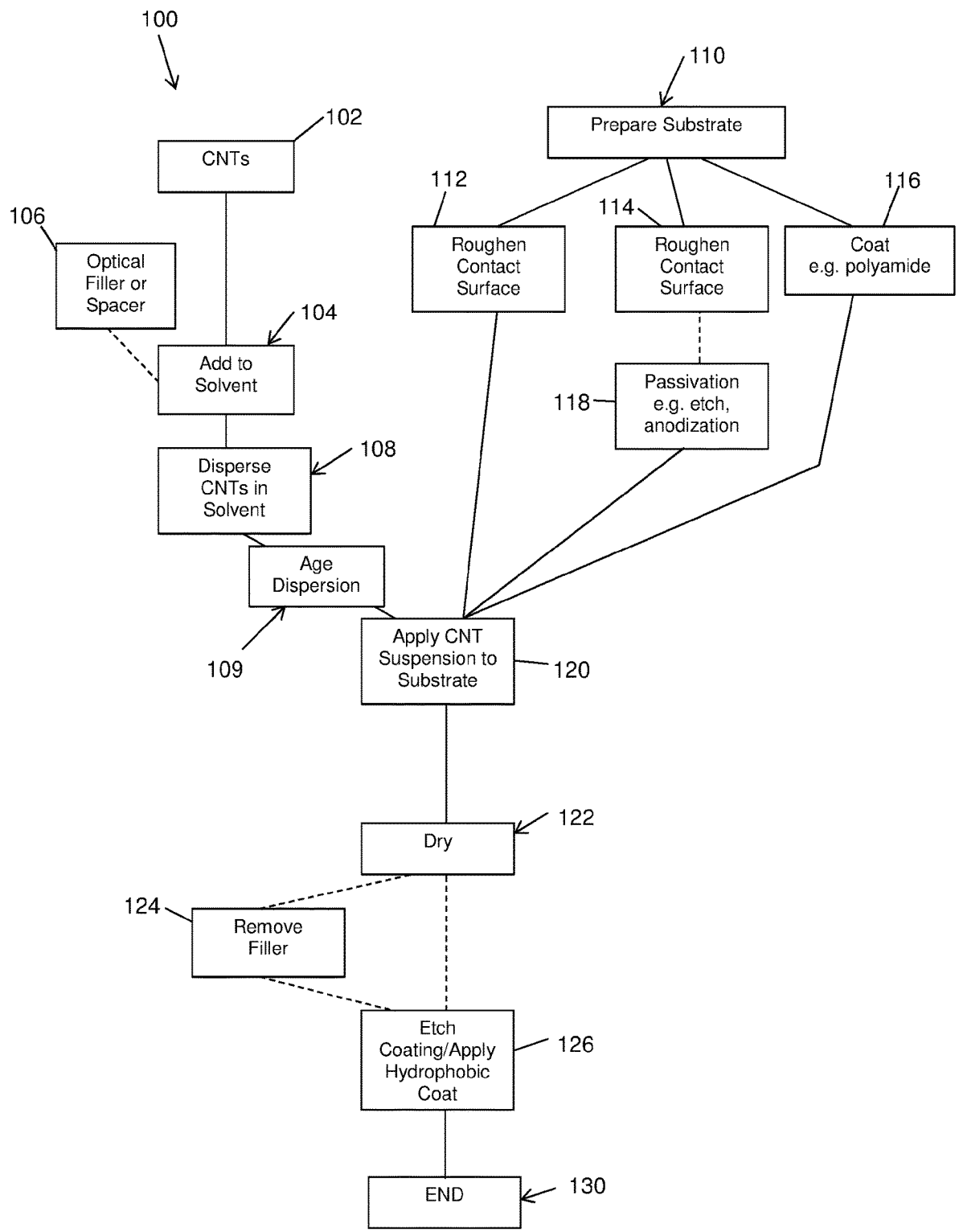
FIG. 9 is a flow chart depicting the preferred embodiments of coating processes.

With reference now to FIG. 9, this shows a flow chart 100 depicting the various stages in the formation of an article according to the teachings herein.

Figure 14:
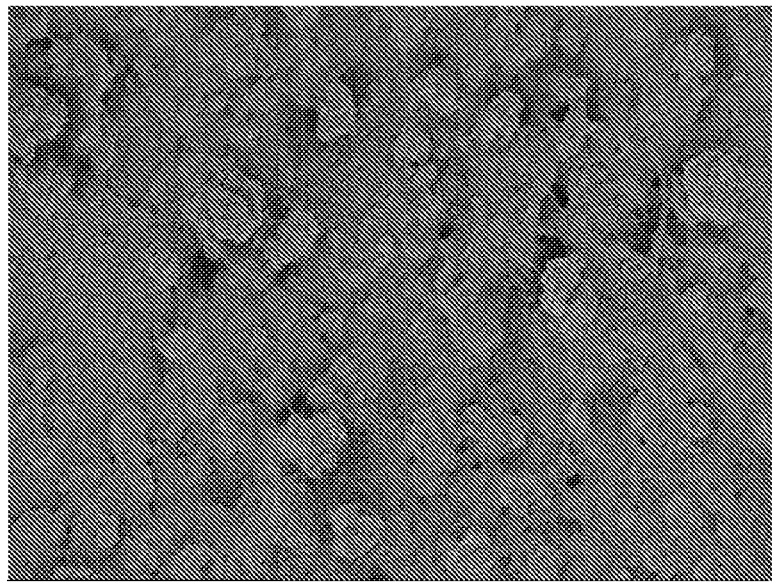
FIG. 14 is an SEM image of a carbon nanostructure layer deposited on a substrate after one day of dispersion aging.
Figure 15:
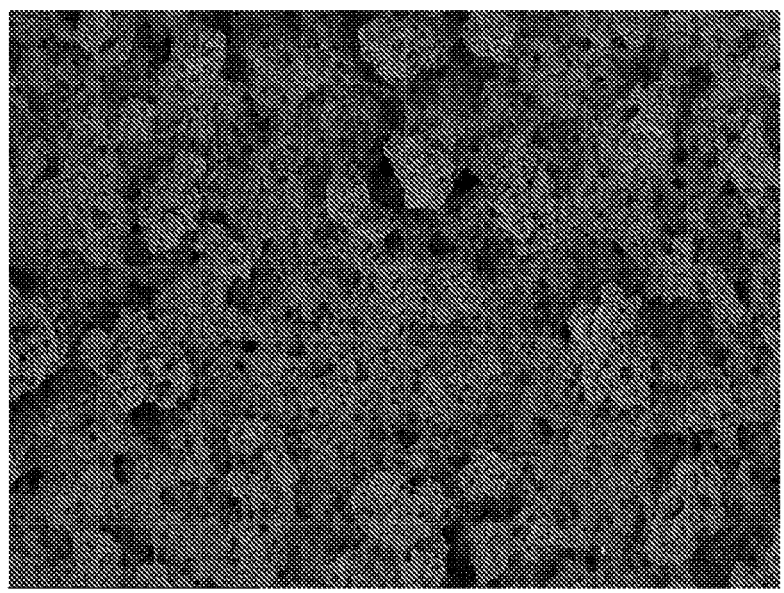
FIG. 15 is an SEM image of a carbon nanostructure layer deposited on a substrate after seven days of dispersion aging.

At step 102, carbon nanostructures, in the preferred embodiment carbon nanotubes, are obtained, as described above either from readily available suppliers or by manufacture thereof. At step 104 the carbon nanostructures are added to a solvent, chloroform for example. At step 106 optical fillers or spacers are optionally added to the solvent, in the case where these are desired. At step 108, the carbon nanostructures and optional fillers or spacers are dispersed in the solvent, typically by sonic dispersion for a period of 3 to 4 hours. It is preferred that the carbon nanotubes have a concentration of 1 mg/ml milligrams per millilitre of solvent. In some embodiments, after sonication the solution is allowed to age, that is left idle for a time, which causes the suspended carbon nanostructures to form small agglomerates (step 109). This agglomeration creates greater surface roughness when the solution is sprayed on the substrate, and so can produce a blacker, more absorbing film. FIGS. 14 and 15, described below, show examples of aging.

At step 110 the substrate 10 to be coated with the carbon nanostructure layer is prepared. This may be by roughening, at step 112 or 114, or by coating with a low outgassing polymer, for example, at step 116. The contact surface may be left in its roughened state from step 112 prior to passing to the coating step 120. In other embodiments, after surface roughening (step 114), the substrate 10 may be passivated, at step 118, by etching or anodization. In other embodiments, the substrate may be passivated without roughening.

At step 120, the carbon nanotube suspension is applied to the contact surface 14 of the substrate, preferably by spraying, although this could also be by any other suitable method such as slot-coating, dipping, brushing and electrostatic coating. At step 122, the coating is dried so as to remove the solvent, at conditions which are appropriate for the solvent which is used. Typically, this may be at room temperature or at elevated temperatures preferably between, for example, about 60° C. to about 300° C.

Where a removable filler is added to the suspension, this may be removed at step 124. Similarly, where desired, the dry coating may then be etched to create optical cavities, at step 126. At step 126 there may be provided a hydrophobic coating over the layer of carbon nanostructures. This could be done at the same time as etching, for example by use of a fluorine containing plasma, in the preferred example carbon tetrafluoride as a precursor, in some embodiments mixed with a hydrocarbon, preferably acetylene. In another embodiment, coating with a hydrophobic material can be carried out after etching of the top surface. The hydrophobic coating may coat through the entire depth of the layer of carbon nanostructures but in preferred embodiments coats only partially through the layer of carbon nanostructures. The hydrophobic coating may partially coat the tops of the surface tubes and functionalise tube defects. Such a coating can prevent capillary action, thereby providing waterproofing, without any increase in THR.

The process concludes at step 130 with a coated substrate.

Figure 10:
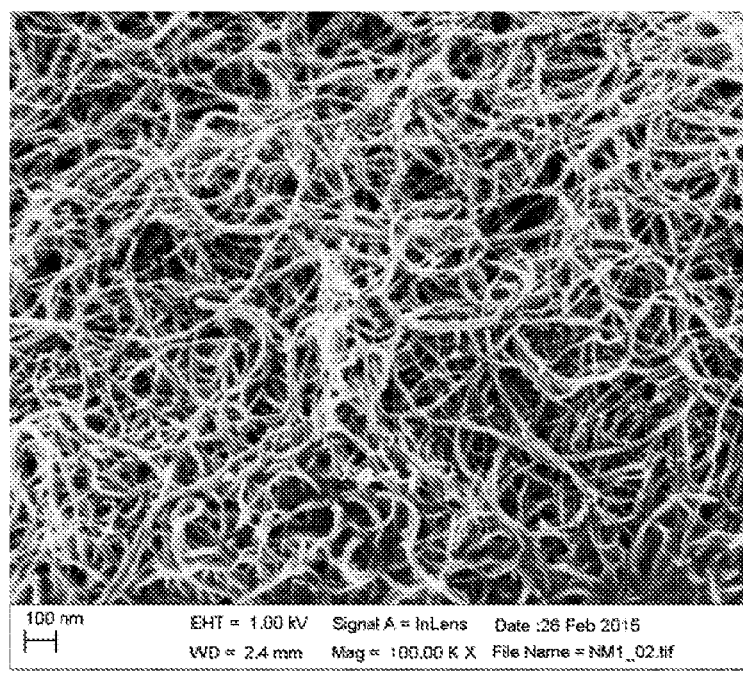
FIG. 10 is an SEM image of a coated sample prior to etching.
Figure 11:
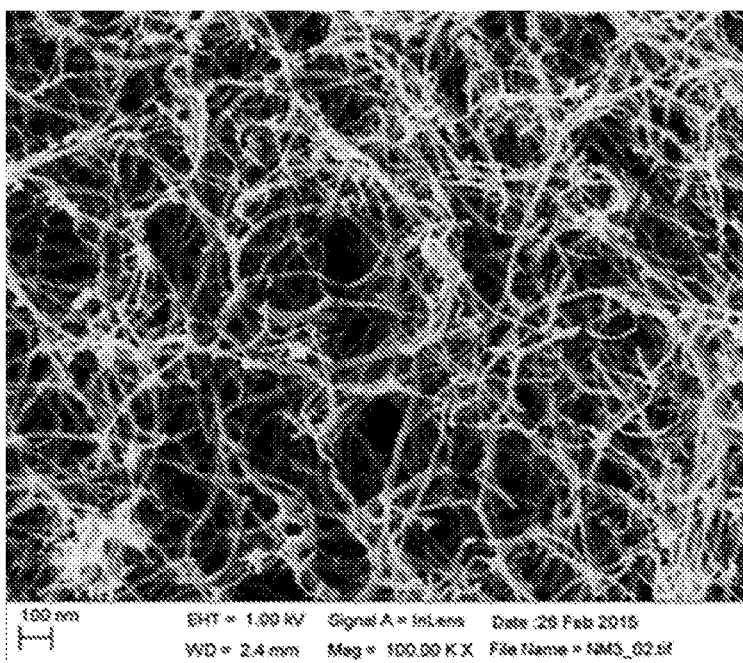
FIG. 11 is an SEM image of a coated sample after etching.
Figure 12:
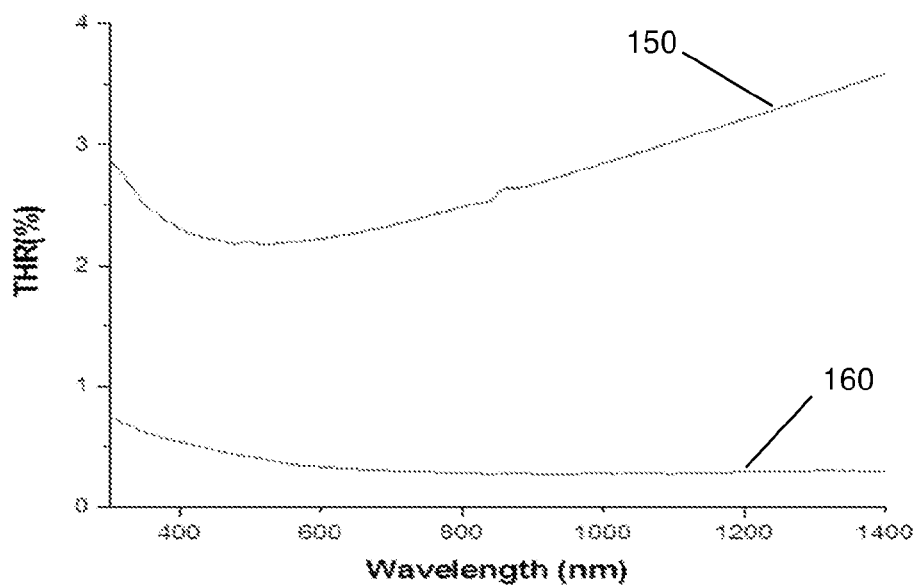
FIG. 12 is a graph showing total hemispherical reflection of the samples of FIGS. 10 and 12.

FIGS. 10 to 15 show characteristics of example embodiments manufactured according to the teachings herein. With reference first to FIGS. 10 and 11, these show, respectively, SEM images of a sample of a carbon nanostructure layer deposited onto a substrate prior to and after etching. The carbon nanotubes form a matrix of randomly oriented filaments, or tubes, on the surface of the substrate, which are all roughly aligned with the plane of the surface of the substrate. Etching of the carbon nanostructure layer creates cavities in the layer, as well as reducing its density. The effect is depicted in the graphs of FIG. 12, where the curve 150 shows the total hemispherical reflectance of the coating prior to etching (that is the coating as shown in FIG. 10), while the curve 160 shows the total hemispherical reflection of the coating after etching (that is the etched coating as shown in FIG. 11). AS can be seen, etching can provide a significant reduction in total hemispherical reflectance and which is consistent over a greater range of wavelengths.

Figure 13:
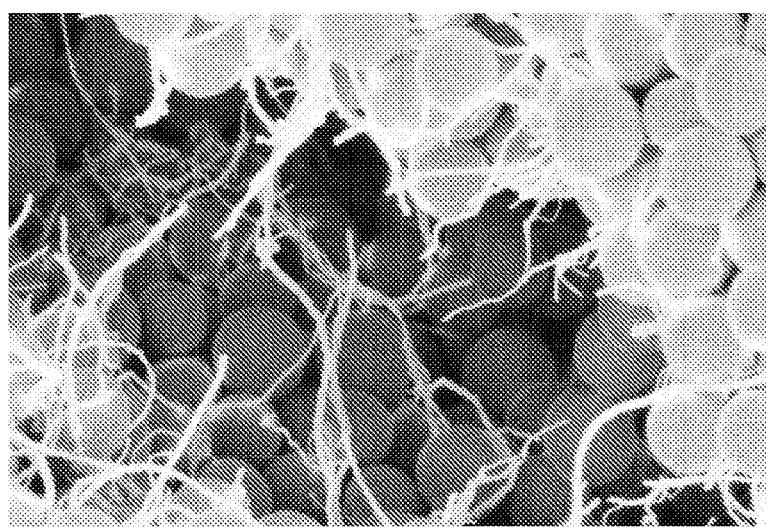
FIG. 13 is an SEM image of a sample having a coating provided with nanosphere fillers to create optical cavities.

FIG. 13 is an SEM image of an example of a coating provided with permanent nanosphere fillers dispersed throughout the carbon nanostructure matrix, creating optical cavities. Fillers of this nature have been found to be particularly effective for absorbing wavelengths from NIR to FIR (15 micrometers to 1 mm wavelength).

FIGS. 14 and 15 show the effect of allowing the dispersion of carbon nanostructures to age, when dispersed in a solution without surfactants. Over time, the dispersed carbon nanostructures in the solution will begin to agglomerate. The inventors have found that this can be beneficial to the formation of a low reflectance coating. FIG. 14 is an image of a carbon nanostructure coating having been aged for one day, that is left for a day after being dispersed in solution. As can be seen, the surface has a roughness, caused by agglomerated, or clumped, carbon nanostructures. FIG. 15 shows a similar coating but applied after 7 days of aging. The layer is significantly rougher than that of FIG. 14. Optimal aging has been found to range from one to around 12 days, after which no further advantage in terms of layer roughness is exhibited. The actual optimal aging time is primarily dependent upon the nature of the carbon nanostructures, the solution, and concentration of the carbon nanostructures. The skilled person will readily be able to determine an optimal time for a specific dispersion from the teachings herein.

The coating may be chosen to exhibit very low reflectivity over a wide range of wavelengths, while in other embodiments it can be tuned to have very low reflectivity at specific wavelengths or wavelength ranges. This is possible by selective etching of the outer surface of the coating layer 20 and/or by selection of particles of the optical spacer or of the removable filler. The skilled person will appreciate also that optical spacers or fillers having a variety of different characteristics (for example particle sizes) can provide differing reflectivity characteristics to the layer 20. For instance, the layer 20 could incorporate a plurality of different optical spacer particles or filler particles.

It is believed that the use of a carbon tetrafluoride and acetylene mix in the plasma creates a carbon fluorine polymer-like coating which is formed on the layer of carbon nanostructures, which is highly hydrophobic and very stable. As explained above, it has been found that carbon tetrafluoride per se may be used successfully, that is without an acetylene or other reactant in the plasma, to form a hydrophobic coating or functionalisation on the layer of carbon nanostructures. Other precursors can likewise be used without an additional reactant in the plasma, including for example: chlorotrifluoromethane (CF3CL), bromotrifluoromethane (CF3Br), trifluoroiodomethane (CF3I), tetrafluoroethylene (C2F4). It is also possible to use nitrogen trifluoride (NF3) and boron trifuloride (BF3), as well as pure fluorine (F2). It is believed that a fluorine or fluorine based precursor in the absence of carbon in the precursor or a separate carbon source will form a functionalised fluorocarbon coating on the carbon nanostructure layer.

Other fluoropolymers may be used, such as polyvinyl fluoride (PVF), polyvinylidene fluoride (PVDF), polytetrafluoroethylene (PTFE), fluorinated ethylene-propylene copolymers (FEP), perfluoro alkoxylated polyfluoroolefins (PFA), and related fluorocarbon and chlorofluorocarbon polymers, which are all good examples of thermally stable, chemically inert materials which can be used to increase the water resistance of materials or structures.

Other embodiments use an organosilane as a precursor.

Figure 16:
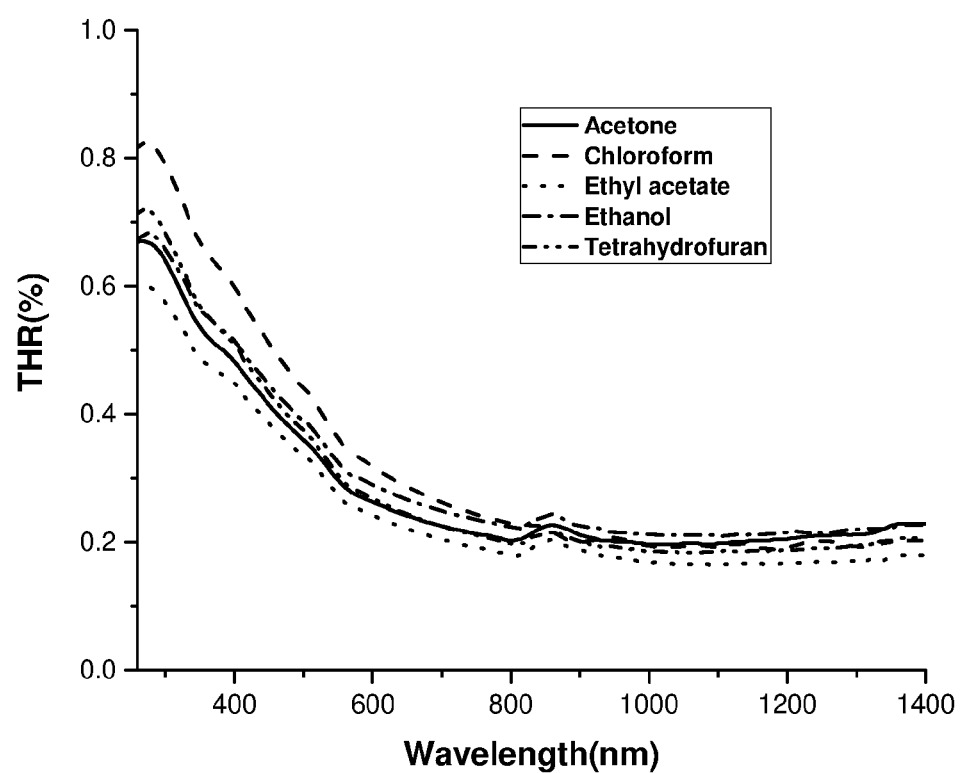
FIG. 16 is a graph of reflectance plotted against wavelength of light in the UV-visible spectrum to show the effect of using a number of different solvents.
Figure 17:
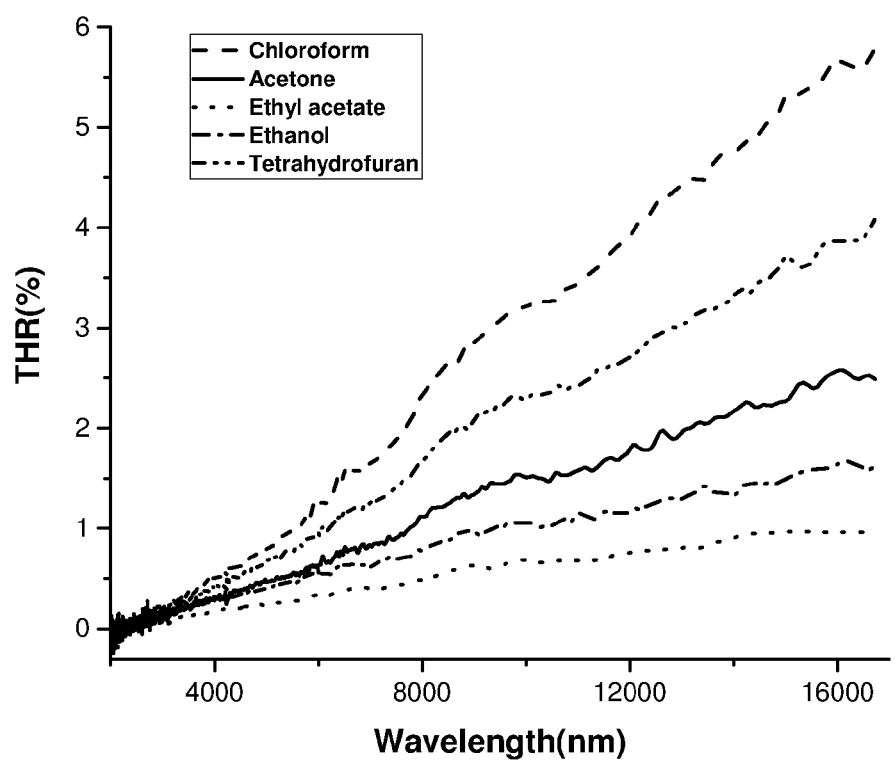
FIG. 17 is a similar graph for the infra-red spectrum for the same solvents as in FIG. 16.

FIGS. 16 and 17 show the effect of using different solvents on the reflectivity of the resulting carbon nanostructure in accordance with the invention. A number of bead-blasted coupons were each sprayed with 40 ml of carbon nanotubes in a variety of different solvents. The spraying was carried out under the same conditions (1 mg of CNT per ml of solvent) using a new spray gun each time. The coupons were then hydrophobically coated using the following procedure:

Hydrophobic Processing

The absorber coating may be made hydrophobic by re-functionalization of the CNTs after the $O_2$ etching. This is achieved by exposing the defective CNTs to a $CF_4$ plasma functionalization (or by means of any precursor able to generate F radicals in a plasma).

The displacement of carbonyl and carboxyl groups through fluorination is thought to render the structure hydrophobic due to the inability of C—F bonds to accept protons necessary for the formation of hydrogen bonds. The fluorine content of carbon nanotubes increases with temperature up to a maximum coverage of $C_2F$ between 250° C. and 300° C. Fluorine bonding shows two different bonding types, depending on the location of the F in the ring. Fluorination of the ring at low temperature is only possible at neighbouring carbon atoms (1,2) generating a meta-stable state where re-combination of the fluorine atoms and degradation of the ring structure may occur through interaction with water or other solvents. A significantly more stable configuration requires the rearrangement of the F atoms to a (1,4) configuration at opposite sides of the ring. The strength of the C—F bond in this case increases to a more covalent character with greater stability. To reach this position, fluorine needs to migrate through the energetically unfavourable next nearest neighbour configuration at (1, 3). At temperatures between 250 and 300°$^{\circ}$ the required activation energy to overcome this thermodynamic obstacle is achieved. Above these temperatures, the graphitic integrity of the tubes begins to break down into amorphous material where coverage can approach CF.

Without wishing to be constrained by theory, it is thought that if a fluorocarbon like $CF_4$ is used on its own the substrate temperature must be heated to at least 100° C., but preferably 250° C.-300° C. (above 300 C the bond is damaged so isn't stable), and the functionalisation takes about 5 minutes at very low power density (about 0.09 Watts/cm sq). A solid film is not thought to be created as there is no hydrogen present to polymerise the reactants. The fluorocarbon radicals simply displace the carboxyl and other polar groups on the CNT defect sites whilst reducing the reflectance of the film by clustering the CNT tips. The time range is from 3 minutes to 12 minutes. Beyond this time the film is damaged in terms of reflectance.

Actual process conditions in this case were as follows (these can be varied depending on reactor design and configuration):

Pressure—0.2-1.2 torr (up to atmospheric pressure)
Power density at 13.56 MHz—preferred 0.09 watts/cm sq but can be from 0.01-4 watts/cm sq
Temperature—20° C.-300° C.
Duration—typically 5 minutes
Gases used—$CF_4$ (most F containing gases can be used)

Before hydrophobic coating, the coupons were plasma etched for 920 s. The results for the total are shown in the Table below and in FIGS. 16 and 17:

|  | After Etching 920s | |
| --- | --- | --- |
|  | THR @ 0.7 mm | THR @ 5 mm |
| Ethyl acetate | 0.20% | 0.23% |
| EtOH | 0.25% | 0.39% |
| Acetone | 0.23% | 0.46% |
| THF | 0.22% | 0.67% |
| Chloroform | 0.26% | 0.80% |

It can be seen that ethyl acetate or ethanol should be a good replacement for chloroform based on THR results in situations where the health risk posed by chloroform should be avoided.

EXAMPLES

Comparative Example 1: Pre-Etched Sample

A solution of multiwall carbon nanotubes (98% carbon basis, O.D.×I.D.×L 10 nm±1 nm×4.5 nm±0.5 nm×3-~6 μm, provided by Sigma Aldrich) in ethyl acetate [Tech grade, provided by ReAgent] of concentration 1 mg/ml was prepared. The boiling point of ethyl acetate is 77.1° C.

The solution was then spray-coated onto an Aluminium 6061 grade substrate according to the following method:
(i) the substrate was pre-heated to a temperature of 100° C.
(ii) the CNT solution was spray-coated onto the substrate using an Iwata Eclipse G6 spray gun, whilst maintaining the temperature of the substrate at/between 80° C. and 100° C. As a result, the solvent evaporated soon after contacting the substrate surface.
(iii) the spray-coating step was continued until a layer of CNTs of at least 2 μm was obtained. The mass of coating per $cm^2$ was measured using a Mettler Toledo balance, model number MS204, and was found to be 1.19 mgcm-2.

Total hemispherical reflectance of the coating was measured using a Shimadzu UV2600 UV-Vis spectrometer with a barium sulphate integrating sphere and a Bruker Vertex 70 IR spectrometer fitted with a Pike Mid IR-IntegratiR with a diffuse gold surface at a spectral range up to wavelengths of 16000 nm. The results are shown in FIG. 18 (for the full spectral range measured) and FIG. 19 (for the spectral range up to wavelengths of 1400 nm).

Example 2: Etched Sample

An aluminium 6061 grade coupon was sprayed according to the procedure set out in Comparative Example 1 until the mass of the coating on the substrate was 1.13 $mgcm^{-2}$. The coating was then subject to an oxygen etch in a plasma reaction chamber (NanoGrowth 400 Etch) to generate the required optical cavities. The etching process comprised a 7 minute oxygen etch at a pressure of 0.3 Torr and a power density of 0.12 $Wcm^{-2}$. Following this the resultant sample was hydrophobically coated, in the same plasma chamber, for 5 minutes in a carbon tetrafluoride plasma at a pressure of 0.3 Torr and 250° C. substrate temperature with a power density of 0.12 $Wcm^{-2}$.

Figure 18:
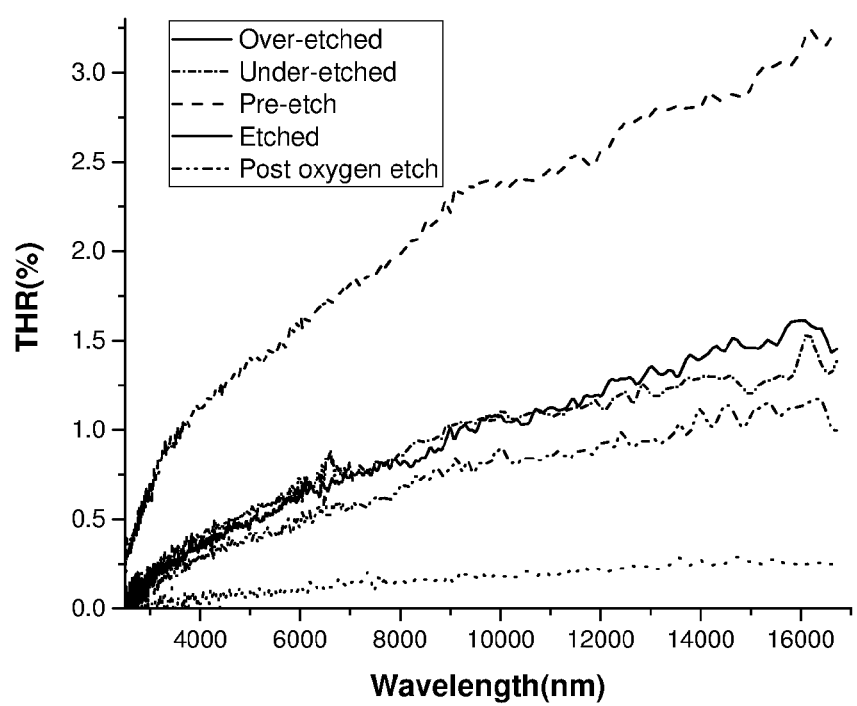
FIG. 18 is a graph of reflectance plotted against wavelength of light to show the effect of various different etching methods.
Figure 19:
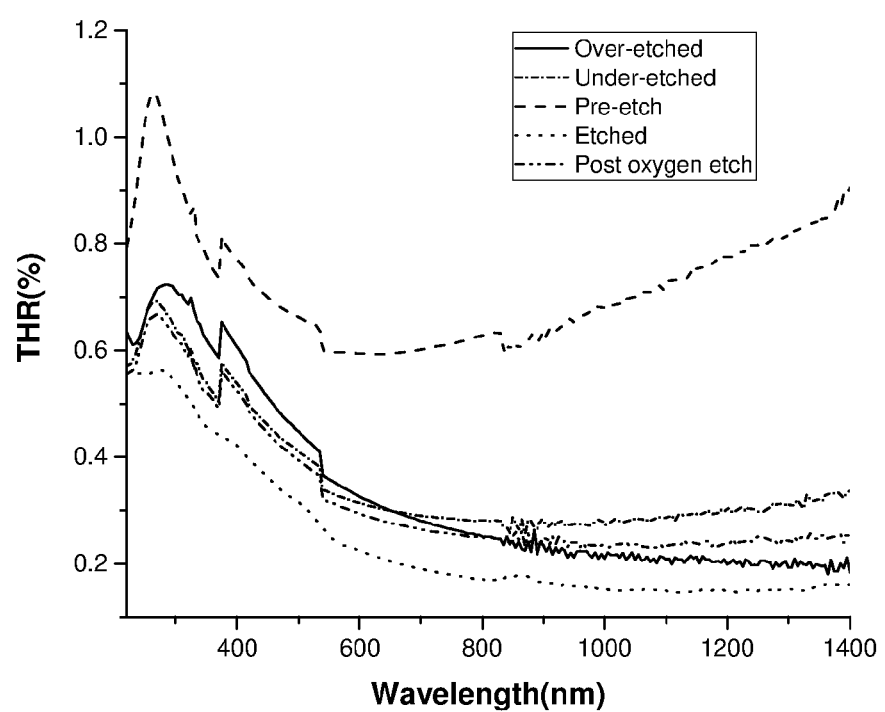
FIG. 19 is an expanded graph showing the same results as that of FIG. 18 but focussing on a narrower wavelength range.

The THR of the resulting coating was measured as for Comparative Example 1 above and the results are shown in FIGS. 18 and 19. It can be seen that the THR is significantly reduced compared to Example 1.

Example 3: Over-Etched Sample

An aluminium 6061 grade coupon as above was sprayed according to the procedure set out in Comparative Example 1 until the mass of the coating on the substrate was 0.33 $mgcm^{-2}$. The sample was then oxygen etched and hydrophobically coated as for Example 2.

The THR of the resulting coating was measured as for Comparative Example 1 above and the results are shown in FIGS. 18 and 19.

The result is a significant over-etch and as a result the reflectance values are increased (but are still lower than those of Example 1).

Example 4: Under-Etched Sample

An aluminium 6061 grade coupon was sprayed according to the procedure set out in Comparative Example 1 until the mass of the coating on the substrate was 1.07 $mgcm^{-2}$. The coating was then etched in an oxygen plasma as before for 7 minutes at a pressure of 0.3 Torr but a reduced power density of 0.045 $Wcm^{-2}$. The sample was then oxygen etched and hydrophobically coated as for Example 2.

The THR of the resulting coating was measured as for Comparative Example 1 above and the results are shown in FIGS. 18 and 19.

The result is that fewer optical cavities are created and thus the reflectance values do not reach optimum levels (but are still lower than those of Example 1).

Example 5: Sample Prior to Hydrophobic Coating

An aluminium 6061 grade coupon as above was sprayed according to the procedure set out in Comparative Example 1 until the mass of the coating on the substrate was 1.05 $mgcm^{-2}$. The sample was then oxygen etched as for Example 2 but removed from the chamber prior to hydrophobic coating.

The THR of the resulting coating was measured as for Comparative Example 1 above and the results are shown in FIGS. 18 and 19. It can be seen that the THR is lower than the figures for Examples 3 and 4 (over the majority of the spectral range) but not as low as the THR for Example 2, which has the additional hydrophobic coating.

Polymer Underlayer

It has been discovered that a substrate having a very low reflectivity can be produced by coating a substrate with a polymer solution, incorporating carbon nanostructures into the polymer solution while it is still wet, drying the substrate and then selectively removing the polymer molecules to leave a nanostructure-rich layer at the surface of the substrate.

Accordingly, in a further aspect of the invention, there is provided a method of coating a substrate with carbon nanostructures, including the steps of:

(i) coating a substrate with a polymer solution which is a polymer dissolved in a first solvent;

(ii) providing a suspension of carbon nanostructures in a second solvent;

(iii) spray-coating the suspension onto the substrate so that the carbon nanostructures are incorporated into the polymer solution;

(iv) drying the substrate to evaporate the first and second solvents to leave a coating of polymer and carbon nanostructures;

(v) plasma etching the coating to remove at least some of said polymer.

wherein following step (iv) and before step (v) the polymers are cured in the coating The product of this method can then optionally be used as a substrate in the method of the first aspect of the invention defined above.

Without wishing to be constrained by theory, it is thought that the selective removal of the polymer leaves pendant nanostructure molecules at the surface of the substrate to which a further coating can be applied in order to result in excellent 'adhesion'.

Exemplary (Non-Limiting) Process:

1) Synthesis of a polymer precursor. A poly(amic) acid derived from Pyromellitic dianhydride (PMDA) and 4,4-oxydianiline (ODA) in dissolved in NMP in a 1:1 molar ratio of reagents to a produce a 14 wt % solution. Efforts are made to exclude all water—the glassware is first heated under a nitrogen flow to remove any adsorbed water. The diamine is dissolved in NMP and once stabilised at room temperature the dianhydride is added to the solution whilst stirring. Continue to stir for 2 hours and then store in the fridge at 5° C. or less until use.

2) The polymer precursor is sprayed onto the substrate using a gravity fed air gun at room temperature. With the current data the average mass applied is 0.36 mgcm$^{-2}$.

3) CNTs are then incorporated into the polymer precursor while still 'wet'—this is essential for successful CNT incorporation. To do this CNTs are dispersed in ethyl acetate (at a concentration of 1 mg/ml) using a high shear mixer and sprayed onto the surface of the polymer precursor at room temperature. It is assumed that the mass of CNTs deposited onto the surface is 0.1 mg cm$^{-2}$.

4) The sample is then 'dried' at 60 C for 60 minutes. Although longer times are typically used this is sufficient for our film thickness.

5) The sample is then heated to 300 C for 20 minutes.

6) CNTs are then exposed using a $CF_4/O_2$ etch (flow rate ratio of 1:4 sccm) for a given time. Typical exposed CNT layer has a thickness of 600 nm to 1000 nm.

Explanations:

1) This polymer was chosen for its shock resistance, high thermal decomposition temperature, its anisotropic mechanical strength and the similarity of thermal expansion between the resultant polymer system to aluminium (c.f. $5.0 \times 10^{\wedge}(-5)$ and $2.4 \times 10^{\wedge}(-5)$/K respectively).

This polymer has the same chemical structure as Kapton and is therefore well known in the literature. Factors within its synthetic process (mainly weight % concentration) were altered so that we could obtain a suitable viscosity for our purpose.

Other polar aprotic solvents could be used as a support medium. DMAc and DMF are commonly used and a THF/MeOH mix has also been shown to act as a solvent system. The reason NMP was selected was that it is the solvent most commonly used for this polymer system. It has a high boiling point which allows enough time for CNT incorporation before evaporation. It is also believed that as NMP is such a good solvent for CNTs it aids the dispersion of CNTs, once in the polymer matrix, and facilitates their uniform incorporation throughout the polymer bulk during the drying and curing stages. This results in a more homogenous composite material.

2) We have shown that an alternative method of applying the polymer precursor onto the substrate is by spin coating. Other alternatives include drop coating, dip coating and to a certain extent painting. To optimise conditions for each of these methods the viscosity of the polymer has been altered. For our change from spin coating to spraying this was done by synthesising at different concentrations. This could be done in two ways: a) Direct synthesis at low wt %—This should achieve a reduced viscosity by decreasing the polymer chain length. b) Synthesis at high wt % and then dilution—The polymer chain length here should be retained however the dilution to a final low wt % loading will allow for the reduced viscosity. In our case we opted for solution a). The reason that b) was not chosen is that in order to achieve a reasonable viscosity for spraying, from the current synthetic method, the final wt % loading of the solution would be so low that in order to achieve a reasonable final film thickness (around 10% of the applied thickness after solvent loss) an unreasonable quantity of solution would have to be applied. This might come with its own problems such as dripping and thus non-uniformities.

This demonstrates that there is a wide range of possible preparative methods to achieve the same result.

We believe that the polymer precursor film, prior to drying, is of the order of 15 µm thick.

3) We have shown that if the polymer precursor is allowed to 'dry' before the CNTs are applied then they are not successfully incorporated into the polymer. However, if applied when 'wet' then the CNTs are incorporated throughout the bulk of the resultant polymer film.

The CNT loading achieved via our method reaches up to 20 wt %. This is an average taken from a range of coupons (substrates) assuming that the polyimide mass is constant at its stated value. This is because they cannot be measured independently with any accuracy due to solvent still present.

To apply the CNTs we currently use the ethyl acetate. NMP is a good solvent for CNTs and therefore could also be used. The main reason that ethyl acetate is advantageous is that it does not add to the film thickness as the solvent evaporates, it does not react with the polymer precursor (as it is aprotic), as it evaporates it allows you to judge when a sufficient amount of CNTs have been applied and it is cheaper. No protic solvents can be used as these will react with the poly(amic) acid precursor thus preventing the curing stage.

4) In the literature 'drying' of the polymer precursor solution, prior to curing, is usually carried out in a dry nitrogen oven and over a longer time period. However, we conducted a mass analysis to show that no additional NMP was lost after just one hour. This, however, is specific to our system and changing film thickness and polymer wt % would affect this time. Although the majority of NMP is lost in this step by evaporation there is a certain quantity that will always remain until the curing stage due to coordination to the amic acid.

We have also demonstrated, by way of spherical components, that the drying and curing process can also be done with a heat gun. As long as the substrate is heated to the required temperature and does not overshoot then this should be feasible on all substrate shapes.

5) Again, this process has been developed to suit our system. It does not work for thicker films, as we have seen cracking during the curing stage (as mentioned above). Degree of curing was measured by IR spectroscopy and it was shown that the same end result, at least by appearance and IR spectroscopy, could be achieved by directly heating to 300 C as opposed to a temperature ramp process over 5 hours.

6) The result of the above steps is a grey composite film which can be touched with no damage. The key part of the process to make it black is the final etch. The etch used is a $CF_4/O_2$ etch (flow rate ratio of 1:4 sccm) which is selective for polyimide. We currently use a power density of 0.611 W cm-2 for between one and two minutes.

The teachings herein are used to make a variety of different articles including, for example for tracking systems, optical detectors and optical telescopes, scientific instrumentation and so on.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

The disclosures in British patent application numbers 1515270.5, 1515694.6, 1516423.9 and 1602031.5, from which this application claims priority, and in the abstract accompanying this application are incorporated herein by reference.

The invention claimed is:

1. A method of coating a substrate with carbon nanostructures to produce a non-transparent coating, including the steps of:
   (i) coating a substrate with a polymer solution which is a polymer dissolved in a first solvent;
   (ii) providing a suspension of carbon nanostructures in a second solvent;
   (iii) spray-coating the suspension onto the substrate so that the carbon nanostructures are incorporated into the polymer solution;
   (iv) drying the substrate to evaporate the first and second solvents to leave a coating of polymer and carbon nanostructures;
   (v) plasma etching the coating to selectively remove at least some of said polymer in order to leave the carbon nanostructures.

2. A method as claimed in claim 1 wherein the polymer is a poly(amic) acid derived from pyromellitic dianhydride (PMDA) and 4,4-oxydianiline (ODA).

3. A method as claimed in claim 1 wherein the first solvent is N-methyl-2-pyrrolidone (NMP), dimethylacetamide (DMAc), dimethylformamide (DMF), tetrahydrofuran (THF), methanol, or any combination thereof.

4. A method as claimed in claim 1, wherein the second solvent is chloroform, ethyl acetate, acetone, cyclohexane, tetrahydrofuran, dimethyl formamide or N-methyl-2-pyrrolidone.

5. A method as claimed in claim 1, wherein in step (iv) the substrate is dried at from 50 to 100° C.

6. A method as claimed in claim 1, wherein in step (iv) the substrate is dried for 30 to 90 minutes.

7. A method as claimed in claim 1, wherein following step (iv) and before step (v) the polymers are cured in the coating.

8. A method as claimed in claim 1, wherein the plasma etching of step (v) takes place using a $CF_4/O_2$ plasma.

9. A method as claimed in claim 1, wherein the plasma etching of step (v) takes place with a flow rate ratio of 1:4 sccm.

10. A method as claimed in claim 1, wherein the plasma etching of step (v) takes place at a power density from 0.05 to 4 $Wcm^{-2}$.

11. A method as claimed in claim 1, wherein the plasma etching of step (v) takes place for a period from 30 seconds to 3 minutes.

12. A method as claimed in claim 1, wherein the suspended carbon nanostructures in said solvent are allowed to agglomerate before being coated onto the substrate.

13. A method as claimed in claim 12, including the step of sonicating the carbon nanostructures in order to disperse them in the solvent and then allowing the suspension to stand until it agglomerates.

14. A method as claimed in claim 1 wherein the plasma etch of step (v) is carried out using a $CF_4/O_2$ etch with a flow rate ratio of 1:4 sccm.

15. A method as claimed in claim 2, wherein a power density of 0.611 W $cm^{-2}$ is used for between one and two minutes.

* * * * *